United States Patent [19]

Tomii et al.

[11] Patent Number: 5,075,751
[45] Date of Patent: Dec. 24, 1991

[54] SEMICONDUCTOR DEVICE

[75] Inventors: Kazushi Tomii; Toshiroh Abe; Takuya Komoda, all of Kadoma, Japan

[73] Assignee: Matsushita Electric Works, Ltd., Osaka, Japan

[21] Appl. No.: 584,485

[22] Filed: Sep. 17, 1990

Related U.S. Application Data

[63] Continuation of Ser. No. 284,399, Dec. 14, 1988, abandoned.

[30] Foreign Application Priority Data

Dec. 18, 1987 [JP] Japan .............................. 62-322336
Apr. 23, 1988 [JP] Japan .............................. 63-100603

[51] Int. Cl.$^5$ .......................................... H01L 29/74
[52] U.S. Cl. ....................................... 357/38; 357/39; 357/91
[58] Field of Search ............................. 357/38, 39, 91

[56] References Cited

U.S. PATENT DOCUMENTS

| | | | |
|---|---|---|---|
| 4,056,408 | 11/1977 | Bartko et al. | 357/38 |
| 4,224,083 | 9/1980 | Cresswell | 357/38 |
| 4,278,475 | 7/1981 | Bartko et al. | 357/38 |
| 4,311,534 | 1/1982 | Bartko et al. | 357/38 |
| 4,816,891 | 3/1989 | Nishizawa | 357/38 |

FOREIGN PATENT DOCUMENTS

| | | | |
|---|---|---|---|
| 3733100 | 4/1988 | Fed. Rep. of Germany | 357/38 |
| 62-76556 | 4/1987 | Japan | 357/38 |
| 60-207376 | 9/1987 | Japan | 357/38 |
| 62-235782 | 10/1987 | Japan | 357/38 |
| 63-205958 | 8/1988 | Japan | 357/38 |
| 1-272157 | 10/1989 | Japan | 357/38 |
| 2-36570 | 2/1990 | Japan | 357/38 |

OTHER PUBLICATIONS

PCIM '88 Proceedings, "Low-Loss High Efficiency, Planar-Gate Normally-Off Type Static Induction (SI) Thyristor", by Abe et al., pp. 165-173.

Primary Examiner—Rolf Hille
Assistant Examiner—Steven Loke
Attorney, Agent, or Firm—Burns, Doane, Swecker & Mathis

[57] ABSTRACT

A semiconductor device is formed with a high specific resistance zone between the anode and cathode zones on each side of the device, with a lattice defect zone in the anode zone in the vicinity of the high specific resistance zone. As a result, the turn-off time for the device can be sufficiently shortened, not only at normal temperatures, but at relatively high temperatures as well.

4 Claims, 3 Drawing Sheets

SEMICONDUCTOR DEVICE

This application is a continuation of application Ser. No. 07/284,399, filed Dec. 14, 1988, now abandoned.

TECHNICAL BACKGROUND OF THE INVENTION

This invention relates to semiconductor devices having on one side an anode zone and on the other side a cathode zone, with a high specific resistance zone and a lattice defect zone positioned between the anode and cathode zones.

Semiconductor devices of the kind can be effectively utilized as, for example, static induction thyristors, insulated-gate bipolar transistors or the like.

DISCLOSURE OF PRIOR ART

The semiconductor devices of the kind referred to have been disclosed in, for example, U.S. Pat. No. 4,056,408 to John Bartko et al, Japanese Patent Application Laid-Open Publication No. 60-207376 of Yoshio Nakamura et al, and so on. In the later Japanese publication, in particular, the semiconductor substrate will have on one side the anode zone and on the other side the cathode zone. The high specific resistance zone is formed between the anode and cathode zones and the lattice defect zone is formed in the same position as the high specific resistance zone, by means of proton irradiation. In other words, the lattice defect zone is formed in this semiconductor device so that the peak value of the distribution of the lattice defects will be in a region of the high specific resistance zone, next to the anode zone.

In this semiconductor device, according to Nakamura et. al., the lattice defect zone, when the device is turned off, causes the holes injected from the anode to disappear quickly, and the device characteristics are such that the turn-off time, as well as the turn-on time is shortened as a result.

However, in the high specific resistance zone at high temperatures the effect of the lattice defects is reduced, resulting in an increased carrier lifetime, thus prolonging the turn-off time. When this device is employed in a circuit where the switching operation is repeated in a short time interval, such as a high frequency inverter circuit, any power loss caused by current flowing during the turn-off is increased, and the heat generated is also increased. The heat generated causes the device temperature to rise, prolonging the turn-off time, and the resulting feedback causes the device performance to degrade. There has been a problem, with lattice defects placed in the high specific resistance zone, that the beneficial characteristics mentioned above cannot be maintained when the device temperature rises, even though the turn-off time is shorter at normal temperatures.

TECHNICAL FIELD OF THE INVENTION

A primary object of the present invention is, therefore, to provide a semiconductor device capable of maintaining a short turn-off time when the device temperature increases, while achieving excellent turn-off characteristic and high reliability.

According to the present invention, this object is attained by providing a semiconductor device comprising an anode zone on one side of the device with a high impurity concentration, a cathode zone on the other side of the device with the other high impurity concentration, a specific high resistance zone formed between the anode and cathode zones with a low impurity concentration zone as an electric current path, and of a lattice defect zone with a relatively low impurity concentration which shortens the carrier lifetime, and said lattice defect zone being positioned between the anode and cathode zones is positioned in the anode zone.

Other objects and advantages of the present invention shall be made clear in following description of the invention detailed with reference to certain embodiments shown in accompanying drawings.

While the present invention shall now be explained with reference to the embodiments shown in the accompanying drawings, it should be appreciated that the intention is not to limit the invention only to these embodiments shown but rather to include all modifications, alterations and equivalent arrangements possible within the scope of the appended claims.

DISCLOSURE OF PREFERRED EMBODIMENT

Figure 1:
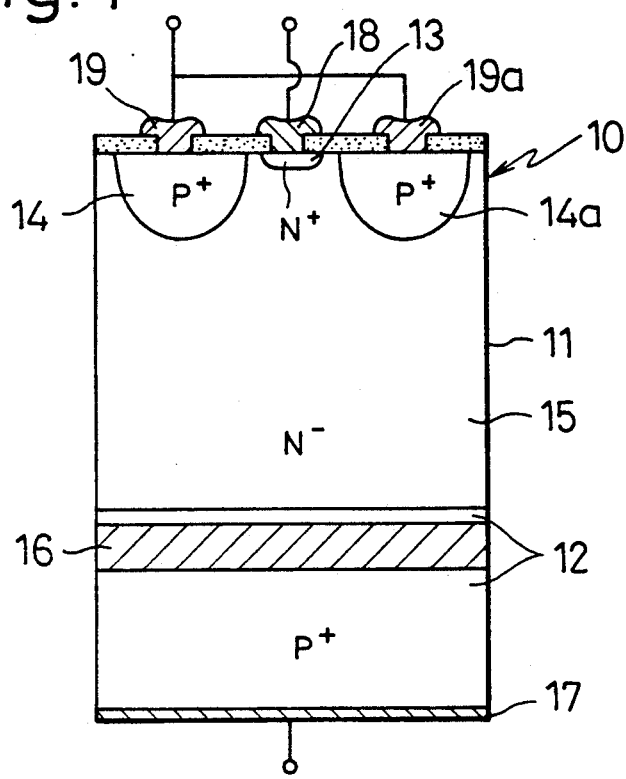
FIG. 1 is a schematic section of the semiconductor device in an embodiment of the present invention as a static induction thyristor.
Figure 2A:
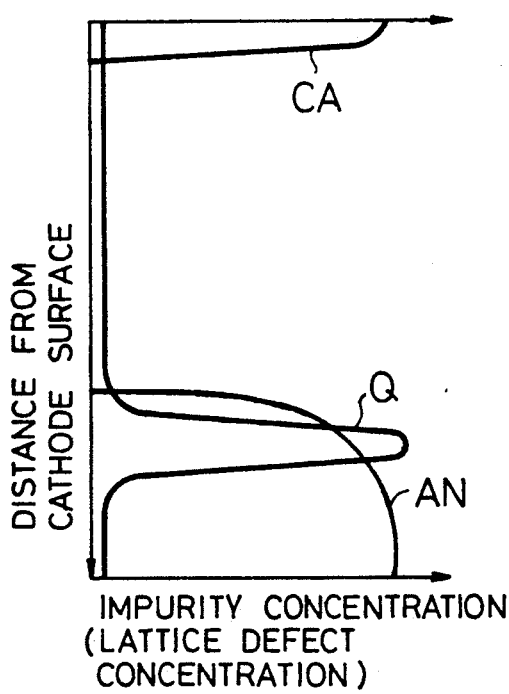
FIG. 2A is a diagram showing the lattice defect distribution and the impurity distribution of the semiconductor device in FIG. 1.

Referring here to FIG. 1, there is shown a semiconductor device 10 according to the present invention. This device 10 constitutes a static induction thyristor. Specifically, the device 10 is comprised of a semiconductor substrate 11, an anode zone 12 formed on one side of the substrate 11 or on the bottom side in the illustration with, for example, a high impurity concentration P+zone, a cathode zone 13 formed on the other side of the substrate 11 or the top side in the illustration with, for example, a high impurity concentration N+zone, and a pair of gate zones 14 and 14a also formed on the top side of the substrate 11 with, for example, a high impurity concetration P+zone. Between the anode zone 12 and the cathode zone 13 in the substrate 1, further, there is formed a high specific resistance zone 15 of, for example, a low impurity concentration N⁻zone, and this high specific resistance zone 15 forms an electric current path. In the anode zone 12, close to the high specific resistance zone 15, there is formed a lattice defect zone 16 by means of, for example, a proton irradiation at some optimum dose. That is, when the impurity distribution of the semiconductor device 10 is as shown in FIG. 2A, the lattice defect zone 16 will be positioned such that the peak value Q of the lattice defect distribution is located inside the impurity distribution curve AN of the anode zone 12 and still closer to an impurity distribution curve CA of the cathode zone 13. In the present instance, the lattice defect zone 16 acts to shorten the carrier lifetime causing holes injected from the anode zone 12 to disappear quickly.

On the anode zone 12 there is an anode electrode 17, on the cathode zone 13 there is a cathode electrode 18, and on the gate zones 14 and 14a there are a pair of gate electrodes 19 and 19a, grown by means of, for example, evaporation techniques.

This semiconductor device 10 is made conducting and non-conducting by controlling both the width of the depletion layer extending into the high specific resistance zone 15 and the height of the potential barrier between the anode and the cathode. With this device 10, the current density can be made very high with a small forward voltage drop, i.e., the ON state resistance can be made small, in addition to making the turn-on time shorter. In addition, in the device 10, the positive holes injected during the turn-off of the device disappear due to the lattice defect zone 16 before they reach the high specific resistance zone 15, and the turn-off time is therefore shortened. The lattice defect zone 16 is formed, on the other hand, not within the high resistance zone 15 which has a relatively low impurity concentration and a relatively high resistance, but within the anode zone 12 which has a relatively high impurity concentration and a relatively low resistance. As a result, the device 10 is less affected by increases in temperature since the lattice defect zone 16 is in a region of relatively high impurity concentration. Because of the lower resistance value, the increase in the power loss of the device is smaller, so the turn-off time can be made to remain small even at higher temperatures.

Figure 2B:
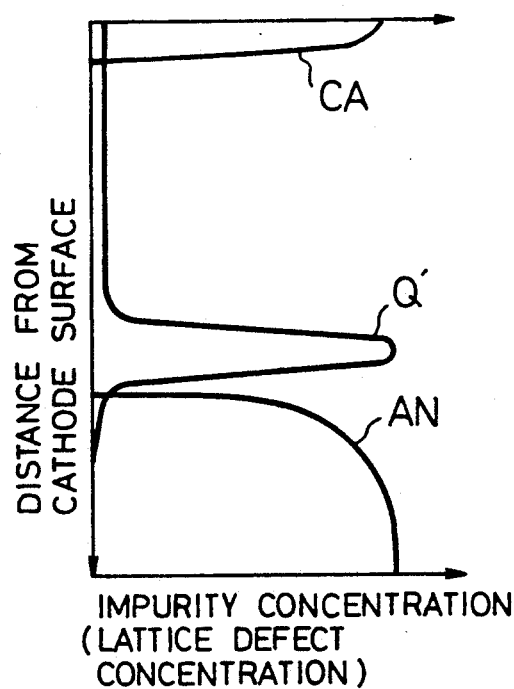
FIG. 2B is a diagram showing the lattice defect distribution and the impurity distribution of a comparative semiconductor device where the lattice defect zone is positioned outside the anode zone.

Referring next to the manufacturing steps of the semiconductor device 10 according to the present invention, the high specific resistance N⁻semiconductor substrate 11 consists of, for example, single crystal silicon and is subjected to an ion implantation of impurities and then to a diffusion treatment, whereby the anode 12, cathode 13 and gate 14, 14a zones are formed at their predetermined positions. Then, the anode 12, cathode 13 and gate 14, 14a zones are provided with electrodes 17, 18, 19 and 19a consisting of, for example, aluminum. Next, protons are irradiated vertically on the front or top side of the semiconductor substrate 11 by means of, for example, a cyclotron accelerator to cause crystal damage in the lattice defect zone 16. In this case, the proton dosage is chosen such that the forward voltage drop due to the lattice defects will not be adversely affected, and the proton acceleration energy is chosen such that the damage will be located as shown in FIG. 2A, and not so that the distribution peak will be positioned as shown in FIG. 2B. In this manner, the static induction thyristor is formed.

In the present instance, if the single crystal silicon substrate forming the semiconductor substrate 10 is about 300 μm in thickness, it is then preferable that the high resistance zone 15 is about 130 μm thick and that the anode zone 12 be made about 150 μm thick. The peak Q of the lattice defect distribution will e positioned about 20 or 30 μm from the junction between the anode zone 12 and the high resistance zone 15. In this case, the optimum proton dose is about $1 \times 10^{12} \text{cm}^{-2}$ to $3 \times 10^{12}$ $\text{cm}^{-2}$.

The proton irradiation introduces lattice defects not only into the anode zone 12 but also into the high specific resistance zone 15, however the concentration of the lattice defects introduced into the high specific resistance zone 15 is negligible compared to that in the anode zone 12. In addition, if a portion of the lattice defect distribution curve extends from the anode zone 12 to the high specific resistance zone 15, this is within the extent of the present invention so long as the main portion of the defect distribution is within the anode zone 12. The optimum defect density is about 1.5 to 2.0 times as large as the defect density as which the sum of the conduction and turn-off power losses at room temperature is a minimum.

Figure 3A:
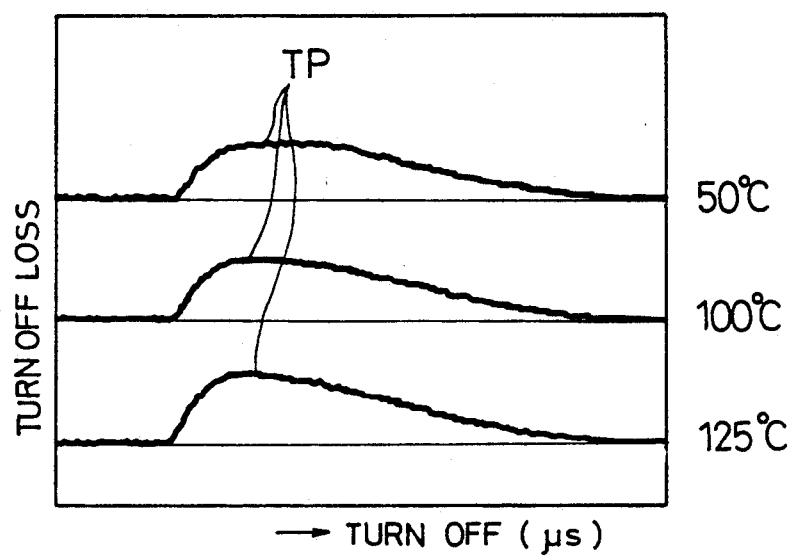
FIG. 3A is a diagram showing the relationship between the device temperature of the semiconductor device in FIG. 1 and the power loss during the turn-off of the device.

Accordingly, a static induction thyristor in which the high specific resistance zone 15 is 130 μm thick, the anode zone 12 is 150 μm thick and the lattice defect distribution peak Q is disposed at the depth of 30 μm from the junction of zones 12 and 15 has been employed as a switching element in a single-ended inverter circuit. The element has been subjected to repetitive switching at a frequency of 50 kHz, and the relationship between the device temperature and the turn-off power loss has been obtained, as shown in FIG. 3A. Another static induction thyristor with a specific resistance zone 15 of 130 μm thickness an anode zone 12 of 150 μm thickness and a lattice defect distribution peak positioned at the junction of the anode and high specific resistance zones has also been employed as a switching element of a single-ended inverter circuit. The element was subjected to repeated switching at a frequency of 50 kHz, and the relation between the device temperature and the relationship between the device temperature and the turn-off power loss is shown in FIG. 3B.

Figure 3B:
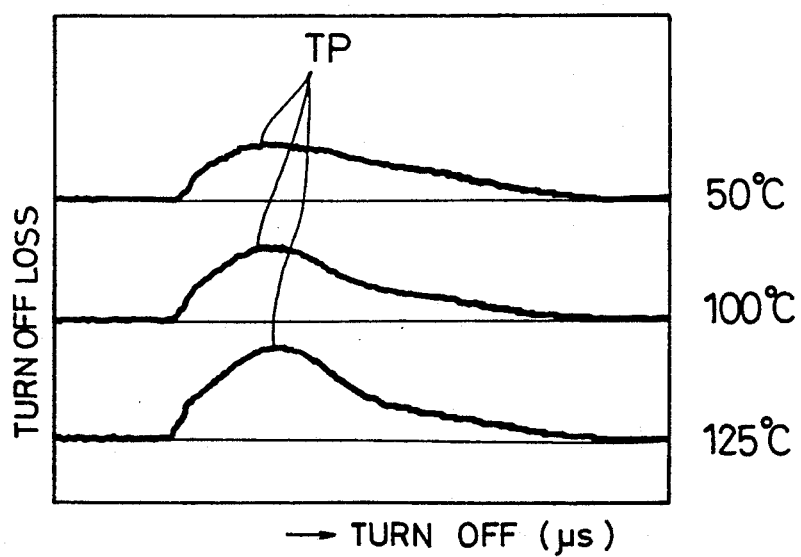
FIG. 3B is a diagram showing the relationship between the device temperature and the turn-off power loss in a comparative semiconductor device where the lattice defect zone is outside the anode zone.

By comparing FIGS. 3A and 3B, one can see that the static induction thyristor fabricated according to the present invention has been found to have excellent high temperature characteristics without showing an increase in the turn-off power loss even when the temperature rises from 50° C. to 125° C. In contrast, the static induction thyristor fabricated as shown in FIG. 2B as a comparative example shows an increase in the turn-off power loss as the temperature is increased from 50° C. to 125° C. It is important to note that the device in FIG. 2B is not reliable under operation at higher temperatures as a result of the increased power loss. However, the device fabricated as shown in FIG. 2A is capable of normal operation even when the device temperature rises by more than 100° C. The turn-off time is comparable to that of devices such as MOSFET's.

Figure 4:
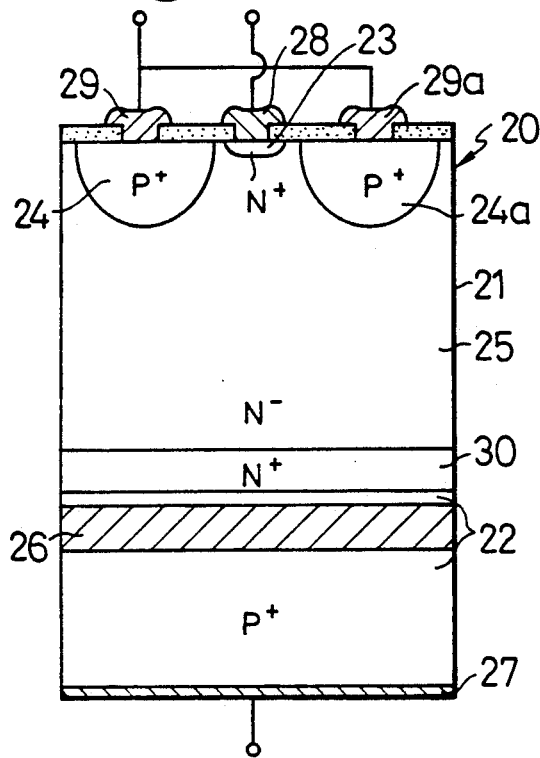
FIG. 4 is a schematic section of another embodiment of the semiconductor device according to the present invention in the form of a static induction thyristor.

In FIG. 4 is shown a semiconductor device 20, a static induction thyristor, which is another embodiment of the present invention. In this device is a buffer zone 30 in the high specific resistance zone 25 at a positron close to the anode zone 22. This buffer zone 30 is a thin impurity layer of the same conduction type as the high specific resistance zone 25 but of a relatively higher concentration. In all other respects, this embodiment is identical to that shown in FIG. 1, with the reference numerals increased by 10. This device is manufactured in a nearly identical manner as the device in FIG. 1, except that steps for the formation of the buffer layer are added to the diffusion and ion implantation processing steps.

Figure 5:
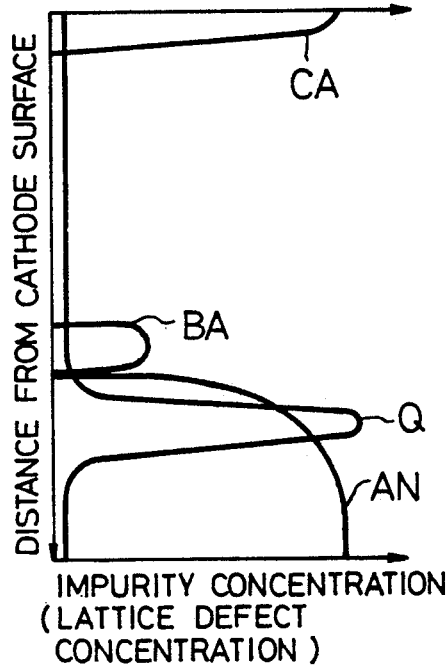
FIG. 5 is a diagram showing the lattice defect distribution and the impurity distribution in the anode and cathode zones as well as in the buffer zone of the semiconductor device of FIG. 4.

FIG. 5 shows the impurity and lattice defect distributions for the semiconductor device in FIG. 4. It should be noted that the lattice defect distribution peak Q is positioned inside the anode impurity curve AN and close to the high specific resistance zone 25 and, in addition, a buffer impurity curve BA appears closer to the anode impurity curve AN.

In the present embodiment, the influence of the device temperature on the power-loss can be reduced and the breakdown voltage characteristics can be improved. As the device is turned off a depletion layer extends from the gate zones 24 and 24a toward the anode zone in response to an applied anode voltage. In the present embodiment the high impurity concentration buffer zone 30 causes the expansion of the depletion layer to be restricted as it reaches the buffer zone 30. As a result, the electric field at the junction between the anode zone and the high specific resistance zone is lowered and a higher punch-through voltage is achieved. In other words, the buffer zone allows for a higher forward voltage drop to be obtained and therefore improves the breakdown voltage characteristics.

In manufacturing the semiconductor devices 10 and 20 according to the both embodiments in FIGS. 1 and 4, it may be possible to employ different methods. The anode zone 12 or 22 consists of a P+semiconductor single crystal water, upon which is grown either an N−layer as the high specific resistance zone 15 of FIG. 1, or an initial N+layer as the buffer zone 30 followed by an N−layer as the high specific resistance zone 25 in FIG. 4. Impurities are then implanted or diffused into the N−zone to form the cathode zone 13 or 23 and the gate zones 14, 14a or 24, 24a. The electrodes 17, 18, 19 and 19a or 27, 28, 29 and 29a are then grown on the anode zone 12 or 22, cathode zone 13 or 23 and gate zones 14, 14a or 24, 24a by means of evaporation of a similar technique. Finally, the lattice defect zone 16 or 26 should preferably be formed by the proton irradiation.

Figure 6:
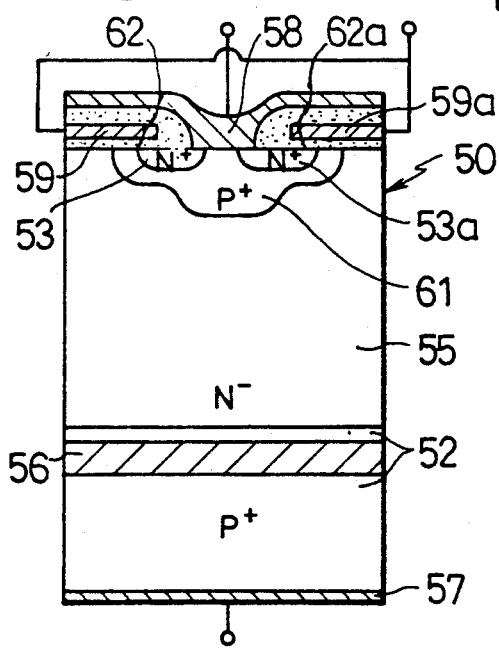
FIGS. 6 and 7 are schematic sections in other embodiments of semiconductor device according to the present invention, in this case insulated-gate bipolar transistors.

The semiconductor device according to the present invention should not be limited to only the static induction thyristor but should also be applicable to, for example, the insulated-gate bipolar transistor. Referring to FIG. 6, there is shown a semiconductor device 50 as the insulated-gate bipolar transistor according to the present invention, in which a pair of cathode zones 53 and 53a are formed on the top surface of a high specific resistance zone 55 which is on top of an anode zone 52 in which a lattice defect zone 56 has been formed at a predetermined position. Between the high specific resistance zone 55 and the cathode zones 53 and 53a, a reverse conduction type zone 61 is formed, composed of a P+impurity zone. The gate electrodes 59 and 59a are formed, with insulation films 62 and 62a, on the reverse conduction type zone 61. An anode electrode 57 is formed on the anode zone 52 and a cathode electrode 58 is formed across the pair of cathode zones 53 and 53a. The preparation steps, and the function of the lattice defect zone 56 should be the same as those of the previous embodiments, and essentially the same effects are achieved.

In the device 50 of the present instance as shown in FIG. 6, a voltage applied to the gate electrodes 59 and 59a causes a channel formed on the surface of the reverse conduction type zone 61 to be modified, controlling an electric current flowing through the high specific resistance zone 55. Any influence or power loss due to the temperature can be decreased by the lattice defect zone 56 in the same manner as the previous examples, and the short turn-off time can be maintained even at higher temperatures.

Figure 7:
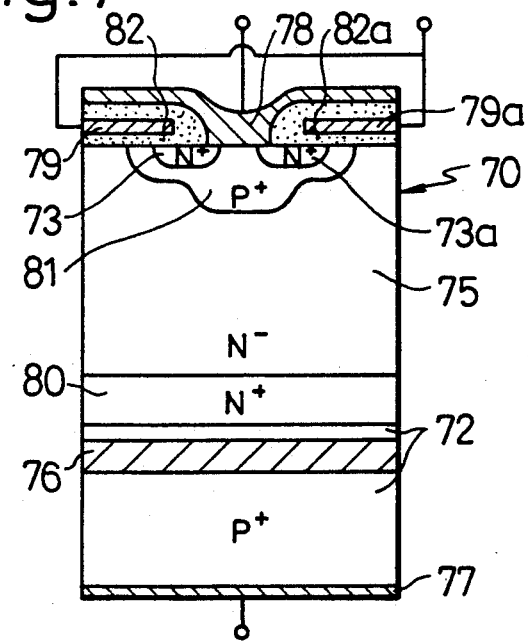

In the device 50, a buffer zone 80 may be formed at a predetermined positron in the high specific resistance zone 75, as shown in FIG. 7, in the same manner as that in the high specific resistance zone 25a in the embodiment in FIG. 4. This buffer zone restricts the expansion of the depletion layer during the turn off of the device and improves the breakdown voltage characteristics. In the embodiment of FIG. 7, all other features are identical to those in FIG. 6, with the reference numerals increased by 20.

In such devices as the insulated-gate type bipolar transistors shown in FIGS. 6 and 7, the cathode zone is referred to as the source zone while the anode zone is referred to as the drain zone.

It should also be noted that many various design modifications can be adopted to this invention. For example the proton irradiation in the previous embodiments is irradiated from the top or cathode side of the devices. The devices could be irradiated from the bottom or anode side to introduce the lattice defect zone.

We claim:

1. A semiconductor device comprising an anode zone of one conduction type formed on one side of the device with a relatively high impurity concentration, a cathode zone of the other conduction type opposite to that of said anode zone and formed on the other side of the device with a relatively high impurity concentration, a high specific resistance zone of the same conduction type as the cathode zone and formed between the anode and cathode zones with a relatively low impurity concentration to act as an electric current path, and a lattice defect zone formed within the anode zone of the relatively high impurity concentration, said lattice defect zone shortening the carrier lifetime to cause holes being injected from the anode zone toward the high specific resistance zone to quickly disappear at normal and high temperature ranges, wherein the lattice defect zone is formed within the anode zone and close to the high specific resistance zone by proton irradiation, with the peak of the defect distribution inside the anode zone to be 20 to 30 μm from a junction between the anode zone and the high specific resistance zone to maintain a short turn-off time in the high temperature range.

2. A device according to claim 1, which further comprises a buffer zone formed within the high specific resistance zone positioned close to the anode zone, composed of the same conduction type as the high specific resistance zone and having a relatively higher concentration than the high specific resistance zone.

3. A device according to claim 2, wherein the proton irradiation dose is between $1 \times 10^{12}$ cm$^{-2}$ and $3 \times 10^{12}$ cm$^{-2}$.

4. A device according to claim 1, wherein the lattice defect zone has an optimum defect density selected to be, as measured at room temperatures, 1.5 to 2.0 times as large as the defect density showing the minimum sum of conduction and turn-off power losses of the device as measured at room temperatures, said optimum defect density sowing substantially no increase in the sum of the conduction and turn-off power loses in the high temperature range.

* * * * *